United States Patent [19]

Levasseur

[11] 4,284,208  
[45] Aug. 18, 1981

[54] VEND CONTROL SYSTEM

[75] Inventor: Joseph L. Levasseur, Chesterfield, Mo.

[73] Assignee: H. R. Electronics Company, St. Louis, Mo.

[21] Appl. No.: 65,280

[22] Filed: Aug. 9, 1979

[51] Int. Cl.³ .............................................. G07F 11/00
[52] U.S. Cl. ........................................ 221/129; 194/2; 221/258; 340/166 R; 307/241
[58] Field of Search ........ 194/2, 10; 221/92, 123–125, 221/129, 258; 307/241; 340/166 R, 166 S

[56] References Cited

U.S. PATENT DOCUMENTS

| | | | |
|---|---|---|---|
| 2,282,164 | 5/1942 | Buswell | 340/166 R |
| 2,446,643 | 8/1948 | Farmer | 340/166 R |
| 3,098,216 | 7/1963 | Samwel | 340/166 R |
| 3,205,481 | 9/1965 | Corbella et al. | 307/241 X |
| 3,852,723 | 12/1974 | Wu | 340/166 R X |

Primary Examiner—Joseph J. Rolla  
Attorney, Agent, or Firm—Haverstock, Garrett & Roberts

[57] ABSTRACT

A vend control system capable of vending products or services as selected comprising a plurality of vend producing devices each capable when actuated of producing a vend, circuits connecting the vend producing devices in a matrix circuit wherein the devices are arranged in first and second groupings, each of the devices having a first and a second input connection, the first input connections of each of the first selected groupings of the devices being connected in common, the second input connections of each of the second selected groupings being connected in common, a first drive circuit having a plurality of input and output connections, the output connections of which are connected respectively to the first input connections of the devices of the first groupings, a second drive circuit having a plurality of input and output connections, the output connections of which are connected respectively to the second input connections of the devices of the second groupings, a control circuit having a first set of outputs connected respectively to the input connections of the first drive circuit and a second set of outputs connected respectively to the input connections of the second drive circuit and an input circuit including a source of input signals, the control circuit producing output responses for applying to the respective inputs of the first and second drive circuits to establish operative connections across a selected one of the vend producing devices, and means to apply energizing potential across said selected one of the vend producing devices.

9 Claims, 3 Drawing Figures

VEND CONTROL SYSTEM

As the vending industry has developed it has become increasingly apparent that it is necessary to simplify the circuitry of vending machines and to provide improved means for selecting between various vend producing devices for energizing. It is important to be able to accomplish this without modifying a increasing the cost or complexity of the basic vending cintrol system. Various means have been devised in the past to improve product selectivity, but most of the known means have involved duplicating the number of parts and components required in a vending machine including duplicating the number of price selection switches, the number of electrical and electromagnetic devices required to control the selection, and duplicating the circuitry associated therewith. The present invention overcomes these and other disadvantages, shortcomings and limitations of the prior art by teaching the construction of a relatively simple circuit for controlling and selecting for energizing from among a plurality of vend producing devices such as the vend motors or solenoids used for dispensing products from a vending machine.

The present device overcomes the shortcomings of the prior art by providing means for connecting the vend producing devices into a matrix circuit wherein selection of a particular vend producing device for energizing can be controlled by an input signal such as an encoded signal that might be produced by a customer actuating one of several selections switches or keys on a control panel or keyboard. This is possible with the present device because when a selection is made it produces distinctive responses which operate through common circuit elements to establish circuits to energize only the desired vend producing device.

It is therefore a principal object of the present invention to provide relatively simple and inexpensive means for controlling selection for operation from among a number of operator members.

Another object is to teach the construction and operation of a selection control circuit that can be used with existing control circuits such as existing vending control circuits with a minimum of modification to the existing circuit.

Another object is to enable a relatively simple code to be used to control the selection for energizing among a number of different possible operator members.

Another object is to make it easier and to program the vending functions of multi-selection vending machines.

These and other objects and advantages of the present invention will become apparent after considering the following detailed specification in conjunction with the accompanying drawings which show simplified block diagrams of several embodiments of the subject vend control means, and wherein.

Figure 1:
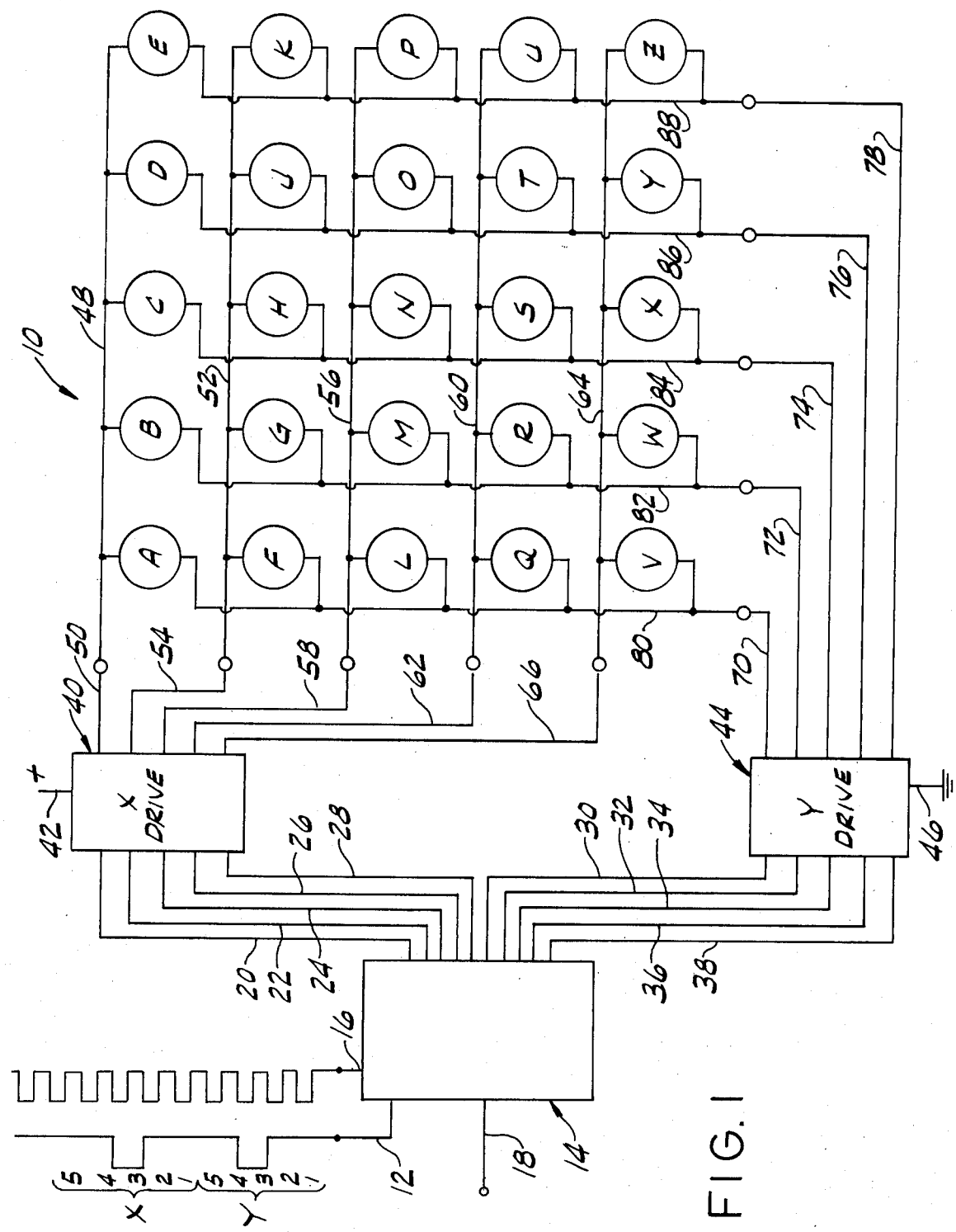
FIG. 1 is a circuit diagram mostly in block form showing one embodiment of the subject selection control circuit.

Referring to the drawings more particularly by reference numbers, number 10 in FIG. 1 refers to a circuit constructed according to the present invention. The circuit 10 has a data input lead 12 on which input signals appear. Several forms of input data can be used in the present device, and in FIG. 1 the input data is shown as being a series of data bits although parallel input data could also be used. The input data can be in X and Y coordinate form or in binary form to name several possibilities. The input lead 12 is connected to a data processing circuit which is shown as shift register 14. The shift register 14 also has a clock input lead 16, a reset input lead 18, and a plurality of output connections including a first set of output connections 20, 22, 24, 26 and 28, designated the X output connections, and a second set of output connections 30, 32, 34, 36 and 38, designated the Y output connections. The X output connections 20–28 are connected as inputs to an X drive circuit 40 which has another input 42 connected to a suitable source of operating voltage. The Y output connections 30–38 are connected as inputs to a Y drive circuit 44, and the Y drive circuit has another connection 46 thereto which is shown grounded.

The X drive 40 and the Y drive 44 have output connections to a matrix type circuit which is formed by a plurality of operator devices such as motors or solenoids, and these devices are labeled from A-Z and are shown arranged in parallel rows and columns for convenience. All of the devices in the first or top row, devices A-E, have one of their two input terminals connected in common by lead 48, and the lead 48 is connected to first output lead 50 of the X driver 40. In like manner, the devices F-K in the second row have respective ones of their input terminals connected to common lead 52 which in turn is connected to output lead 54 of the X drive 40. In similar manner the devices L-P of the third row have respective input terminals connected by lead 56 to output lead 58 of the X driver 40, the devices Q-U of the fourth row have respective input terminals connected by lead 60 to fourth output lead 62 of the X driver 40, and the devices V-Z of the fifth row have one of their input terminals connected to lead 64 which in turn is connected to the remaining output lead 66 of the X driver 40.

In order for the X portion of the circuit to operate when the shift register 14 receives an input signal on lead 12, it is necessary for an output to be produced on a selected one of the shift register output leads 20–28. This causes a corresponding output on one of the outputs 50, 54, 58, 62 or 66 to be placed in electrical communication with the input lead 42 which is connected in electrical communication with the input supply lead 42. As an example, if there is an input to the X driver on the third input lead 24, then the third output connection 58 will communicate with the source of supply voltage which will be applied on lead 56 and to one terminal of each of the devices L-P in the third row. In order for any one of these devices to be energized to cause a vend, its other input connection must be connected to ground. This means for doing this is through the Y drive circuit 44.

The Y drive circuit 44 operates similarly to the X drive circuit 40 except it has its output leads 70, 72, 74, 76 and 78 connected to common terminals of the devices in the respective columns rather than in the respective rows. For example, the output connection 70 of the Y drive 44 is connected by lead 80 to one of the connections of each of the devices A, F, L, Q or V in the first column. Similarly the second Y output 72 is connected by lead 82 to one of the connections of each of the devices in the second column, Y output lead 74 is connected by lead 84 to one of the connections of each of the devices in the third column, Y output lead 76 is connected by lead 86 to one of the connections of each of the devices in the fourth column, and Y drive output lead 78 is connected by lead 88 to one of the connections of each of the devices in the fifth column. When a selected one of the shift register 14 outputs is activated, such as the second Y output 32, the Y drive 44 will establish circuit continuity between the common lead 82 of the second column, and ground on lead 46. In the example as shown with an output from the X drive on leads 58 and 56, and an output from the Y drive 44 on the output leads 72 and 82, a circuit will be established for energizing the device M which is in the third row and second column. When this happens the operating voltage potential on lead 42 will be applied to one side of the M device and the opposite side of the M device will be connected to ground thereby energizing the M device. However, with the circuit connected as shown in FIG. 1 there is the further possibility for lesser amounts of current to flow through other series combinations of devices which may or may not be objectionable. For example, in the illustrated situation where the M device is energized, alternative circuits are produced through the series combinations of devices N, H and G; N, S and R and others. These possibilities will undesirably increase the current requirement, and are eliminated in the constructions shown in FIGS. 2 and 3 by the use of diodes.

By applying selected input data signals to the control circuit 14 it is possible to select for energizing any one of the devices A-Z. The input data required to make a desired selection can have many forms, and the means for making a selection can include selection switches, a keyboard or other similar device, and the particular input can be in serial or parallel bit form which is largely a matter of preference. In FIG. 1, the inputs to the shift register 14 are shown as including a source of equally spaced clock pulses which are entered on input lead 16. The clock pulses may be produced by a strobe, a pulse generator, or any other suitable clocking device. The other data inputs to the shift register 14 are shown as a series of pulses which correspond in time to particular pulses of the clock train. These pulses are used to produce responses that represent the X and Y components of the desired selection. The source of the data input signals can be a simple control panel with X and Y (or numbered or alphabetized) pushbuttons which when actuated produce the desired responses. It can include in the case illustrated, five X and five Y position keys or switches which when actuated produce pulses that are entered in the register 14 with the clock pulses and used to produce outputs on particular ones of the X and Y leads 20-38. The input signals on the lead 12 are timed to occur simultaneously with clock pulses on input 16, and in FIG. 1 the Y pulse is shown in the third position and the X pulse in the second position. In order to operate the device, assuming an adequate deposit is made, the customer actuates selected X and Y pushbuttons or keys or other means which generate the desired timed pulses corresponding to the row and column of the selected vend. This causes entries to be made and circuits to be established as indicated above to energize the motor to deliver the desired vend. By increasing or decreasing the number of rows and columns of the vend delivery devices the number of possible vends can be increased or decreased, and this can be done with relatively little additional circuitry or circuitry change required.

Figure 2:
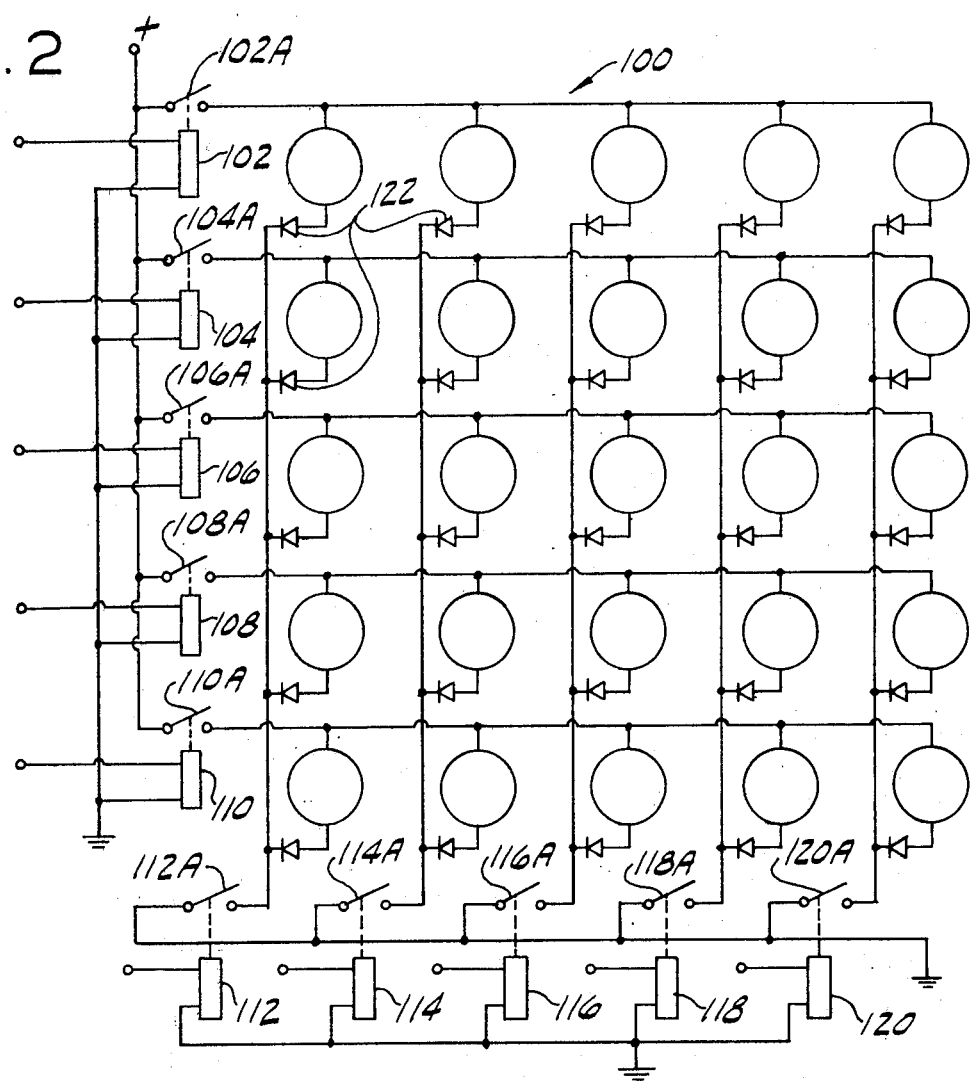
FIG. 2 is a circuit diagram showing another embodiment of the subject control circuit.

FIG. 2 shows a circuit 100 which is somewhat similar to the circuit of FIG. 1 and may include similar input means such as input circuits 14, 40 and 44. The circuit of FIG. 2 has a plurality of vend producing devices or motors labeled similarly to those in FIG. 1. In order to select a particular device or motor for energizing it is necessary with the circuit of FIG. 2 to energize two relays or solenoids, one to control the X selection for a particular row of the devices to be energized and the other to control the Y selection for the particular column in which the desired device to be energized in located. The modified circuit 10 has five X relays 102, 104, 106, 108 and 110 which have their coils connected respectively to the five outputs of a circuit such the X drive circuit 40, and five Y relays 112, 114, 116, 118 and 120 which have their coils connected respectively to the different outputs of a circuit such as the Y drive circuit 44. The opposite sides of the X and Y relays are connected to ground. Each of the relays 102-120 has associated normally open relay contacts which are closed when the respective relay is energized to establish a circuit to one side of each of the devices in the associated row and column. The relay contacts have the same identifying numbers as the relay with the suffix A.

Also, in the circuit 100 each of the vend delivery devices has a diode connected in series with one of its terminals in the manner shown. All of the diodes are labeled 122 and are included in the circuit to prevent any alternative current flow paths such as those described above in connection with FIG. 1. This is preferred to reduce the power requirement of the circuit and to prevent the undesirable partial energizing of non-selected vend delivery devices. When a selected one of the X relays 102-110 is energized its contacts close to allow power to be applied to one side of each vend producing device in the associated row. When one of the Y relays is energized its contacts close to establish a ground connection to the devices in the associated column of vend delivery devices. This means when an X and a Y relay are simultaneously energized a circuit will be established through a particular one of the vend delivery devices to energize it. When this happens no alternate circuits are established through other vend delivery devices because of the diodes 122. Except for the features described, the construction and operation of the circuit 100 is similar to that of the circuit of FIG. 1.

Figure 3:
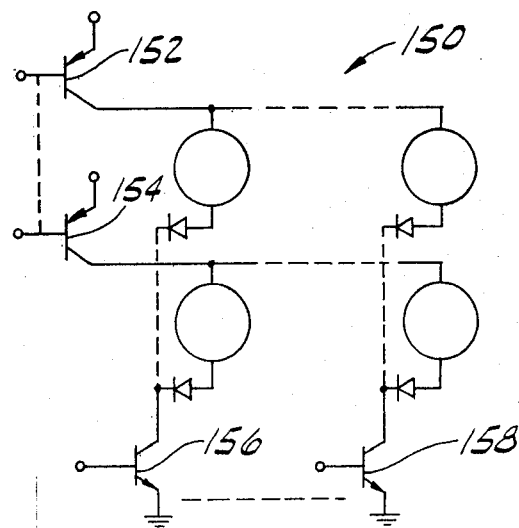
FIG. 3 is a portion of a circuit diagram showing yet another embodiment of the subject control circuit.

FIG. 3 shows a portion of another embodiment 150 of the present circuit wherein the rows and columns of vend producing devices are connected to the collectors of X transistors 152 and 154 and the Y transistors 156 and 158. When an X signal is received on a particular output of the X drive circuit 40 it will cause the associated transistor 152, 154 and so on to conduct to establish a circuit connection to a power source. When a signal is present on one of the Y drive outputs it causes one of the Y transistors 156, 158 and so forth to conduct to establish a connection to ground. The other structural and operational features of the circuit 150 of FIG. 3 including the input means may be similar to those described above in connection with FIGS. 1 and 2.

Thus there has been shown and described a novel vend control system for controlling the selection for energizing of any one of a plurality of product delivery devices, which system fulfills all of the objects and advantages sought therefor. It will be apparent to those skilled in the art, however, that many changes, modifications, variations, and other uses and applications of the subject control system are possible, and all such changes, modifications, variations, and other uses and applications which do not depart from the spirit and scope of the invention are deemed to be covered by the invention which is limited only by the claims which follow.

What is claimed is:

1. A control circuit including means for selecting for energizing one among a plurality of operator members comprising a plurality of operator members each having first and second input connections, means connecting said operator members into a matrix circuit wherein the operator members are arranged electrically into first and second groupings wherein the first input connections of operator members in each of the respective first groupings are connected together and wherein the second input connections of operator members in each of the respective second groupings are connected together, a power source having first and second power connections and an operating voltage therebetween, means for establishing an operating voltage across a selected one of the operator members, including means for establishing a connection between the first power connections and the first input connections to a selected first grouping of operator members, means for establishing a connection between the second power connection and the second input connections to a selected second grouping of operator members, a source of input pulses encoded to control which of said operator members will be connected across the power source, said source including a plurality of selection devices each actuatable to establish a selection of one of said plurality of operator members and capable when actuated of producing a distinctively time encoded pair of pulses, a data storage device having a first input connected to said source of encoded input pulses for storing in the data storage device information representative of the pair of pulses produced when a selection device is actuated, a source of clock pulses and a second input to the data storage device connected to said source of clock pulses, said data storage device storing the time encoded signals based on comparison thereof with the clock pulses, said data storage device having first and second sets of output connections, a first driver circuit having a set of input connections connected respectively to the output connections of the first set of output connections of the data storage device, a second driver circuit having a set of input connections connected respectively to the output connections of the second set of output connections of the data storage device, means connecting the first power connection to the first driver circuit, means connecting the second power connection to the second driver circuit, said first driver circuit having a plurality of output connections each of which is connected to the first input connections of operator members of a respective first grouping, said second driver circuit having a plurality of output connections each of which is connected respectively to the second input connections of operator members of a respective second grouping, first control means for establishing a circuit connection between the first power connection and the first connections to the operator members in a selected first grouping, and second control means for establishing a circuit connection between the second power connection and the second connections to the operator members in a selected second grouping.

2. The control circuit of claim 1 including unidirectional current flow means associated with the first input connections to each of said operator members.

3. In a vend control circuit capable of vending a plurality of different products the improvement comprising a plurality of operator actuatable product selection devices, a source of time encoded pulse pairs the encoding of the pulses of each pulse pair corresponding to a different product capable of being selected, said source having inputs connected to the product selection devices and an output, actuation of selected ones of the operator actuatable product selection devices producing an output from said source encoded to correspond to different ones of the plurality of different products, means to store representations of said pulse pairs including an input connected to the output of the source of pulse pairs, said storage means having a first set of outputs on which outputs are produced that correspond to one of the possible encoding conditions of one of the pulses of said pulse pairs and a second set of outputs on which outputs are produced that correspond to possible encoding conditions of the other of the pulses of the pulse pairs, a plurality of operator members corresponding respectively to the plurality of different products that can be vended, each of said operator members having first and second electric input connections, means connecting the first input connections of the operator members into common connected sets of the first input connections corresponding in number to the number of possible encoding conditions of the one of the pulses of each of said pulse pairs, means connecting the second input connections of the operator members into common connected sets of the second input connections corresponding in number to the number of possible encoding conditions of the other of the pulses of each of the pulse pairs, a source of energy having first and second outputs for applying across a selected one of the operator members to energize same, means under control of the first set of outputs of the storage means for controlling connection between the first output of the energy source and the input connection to the first set of operator members that corresponds to the said one pulse of each of the pulse pairs and means under control of the second set of outputs of the storage means for controlling connection between the second output of the energy source and the input connection to the second set of operator members that corresponds to the other pulse of the corresponding ones of the pulse pairs.

4. In the vend control circuit of claim 3 each of said first input connections to the operator members has a unidirectional current flow device therein.

5. In the vend control circuit of claim 3 the pulse storage means includes a shift register having a first input connected to the source of pulse pairs, a second input connected to a source of clock pulses, and an enable input connected to a source of enabling pulses.

6. In the vend control circuit of claim 3 a first driver circuit having a plurality of inputs connected respectively to the outputs of the first set of outputs of the storage means, said first driver circuit having a first power input connection to the first output of the energy source and a plurality of output connections connected respectively to the sets of first input connections to the operator members, and a second driver circuit having a plurality of inputs connected respectively to the outputs of the second set of outputs of the storage means, said second driver circuit having a second power connection to the second output of the energy source and a plurality of output connections connected respectively to the sets of second input connections to the operator members.

7. In the vend control circuit of claim 6 said first and said second driver circuits each includes a plurality of relay devices including coil portions connected to the respective outputs of the storage means and associated relay contacts connected to the respective first and second power connection of the energy source and to the respective sets of first and second inputs to the operator members.

8. In the vend control circuit of claim 6 said first and second driver circuits each includes a plurality of solid state switching devices each having a first input connected to respective outputs of the storage means, a power connection to the respective first and second power connection of the energy source, and output connections to the respective sets of first and second inputs to the operator members.

9. In a vend control circuit capable of vending a plurality of different products comprising a source of input signals in binary form including means for producing a distinctive binary signal to correspond to each different product to be vended, means for selecting a particular binary signal which corresponds to a selected one of a plurality of products to be vended, means to store each selected binary signal, said storage means having an input connected to the source of binary signals and first and second sets of output connections, the first set of output connections corresponding respectively to one parameter of each stored binary signal and said second set of output connections corresponding respectively to a different parameter of each stored binary signal, a plurality of operator members corresponding respectively to each different product that can be selected for vending, each of said operator members having first and second electric input connections, means connecting the first input connections of the operator members into a plurality of common connected sets of the first input connections corresponding respectively to different possible parameters of the first parameter of the stored binary input, means connecting the second input connections of the operator members into different common connected sets of said second input connections corresponding respectively to different possible parameters of the second parameter of the stored binary signal, a source of energy having first and second outputs for connecting across a selected one of the operator members to energize same, means under control of the first set of outputs of the storage means for controlling connection between the first output of the energy source and a selected one of the input connections to the first set of operator members that corresponds to the first parameter of the stored binary signal, and means under control of the second set of outputs of the storage means for controlling connection between the second output of the energy source and a selected one of the input connections to the second set of operator members that corresponds to the other parameter of the stored binary signal.

* * * * *

UNITED STATES PATENT OFFICE
CERTIFICATE OF CORRECTION

Patent No. 4,284,208　　　　　　　　Dated August 18, 1981

Inventor(s) Joseph L. Levasseur

It is certified that error appears in the above-identified patent and that said Letters Patent are hereby corrected as shown below:

Column 4, line 11　"in" second occurrence should be

--is--

Column 4, line 12　"10" should be

--100--

Column 7, line 12　after "and" insert

--said--

Signed and Sealed this

Twentieth Day of October 1981

[SEAL]

Attest:

Attesting Officer

GERALD J. MOSSINGHOFF

Commissioner of Patents and Trademarks